(12) United States Patent
Han

(10) Patent No.: US 12,431,385 B2
(45) Date of Patent: Sep. 30, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Qinghua Han, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 371 days.

(21) Appl. No.: 18/313,417

(22) Filed: May 8, 2023

(65) Prior Publication Data
US 2023/0274973 A1 Aug. 31, 2023

Related U.S. Application Data

(63) Continuation of application No. PCT/CN2022/137301, filed on Dec. 7, 2022.

(30) Foreign Application Priority Data

Jan. 7, 2022 (CN) .......................... 202210016563.4

(51) Int. Cl.
*H01L 21/762* (2006.01)
*H10B 12/00* (2023.01)

(52) U.S. Cl.
CPC ....... *H01L 21/76229* (2013.01); *H10B 12/02* (2023.02); *H10B 12/482* (2023.02); *H10B 12/488* (2023.02)

(58) Field of Classification Search
CPC . H01L 21/76229; H10B 12/02; H10B 12/482; H10B 12/488; H10B 12/05;
(Continued)

(56) References Cited

U.S. PATENT DOCUMENTS

| 8,896,059 | B1 | 11/2014 | Kim |
| 10,204,913 | B2 | 2/2019 | Kim et al. |

(Continued)

FOREIGN PATENT DOCUMENTS

| CN | 103165539 A | 6/2013 |
| CN | 104347379 A | 2/2015 |

(Continued)

OTHER PUBLICATIONS

International Search Report cited in PCT/CN2022/137301 mailed Feb. 15, 2023, 9 pages.

(Continued)

*Primary Examiner* — Jarrett J Stark
(74) *Attorney, Agent, or Firm* — Kilpatrick Townsend & Stockton LLP

(57) ABSTRACT

Embodiments of the present disclosure provide a semiconductor structure and a manufacturing method thereof, which relate to the field of semiconductors. The method includes: providing a base; forming a plurality of first trenches extending along a first direction in the base, the first trenches forming the base into semiconductor layers arranged at intervals, and filling the first trenches with a first isolation layer; forming a plurality of second trenches extending along a second direction in the semiconductor layers and the first isolation layer, to form the semiconductor layers into a plurality of separate semiconductor pillars and initial bit lines located below the semiconductor pillars; forming third trenches parallel to the first trenches at positions lower than the second trenches; and filling the second trenches and the third trenches with a second isolation layer, where a part of the second isolation layer in the third trenches has gaps.

14 Claims, 13 Drawing Sheets

(58) Field of Classification Search
CPC ...... H10B 12/315; H10B 12/30; H10B 12/34; H10D 30/025
See application file for complete search history.

(56) References Cited

U.S. PATENT DOCUMENTS

| | | | |
|---|---|---|---|
| 2012/0119286 A1 | 5/2012 | Kim et al. | |
| 2014/0001527 A1* | 1/2014 | Myung | H01L 21/02697 257/296 |
| 2014/0024214 A1* | 1/2014 | Kim | H01L 21/02697 438/675 |
| 2014/0061850 A1* | 3/2014 | Cho | H01L 21/764 257/506 |
| 2019/0035791 A1 | 1/2019 | Zang et al. | |
| 2023/0013070 A1* | 1/2023 | Shao | H10B 12/315 |
| 2023/0014198 A1* | 1/2023 | Shao | H10B 12/395 |
| 2023/0274973 A1* | 8/2023 | Han | H10B 12/02 257/773 |
| 2025/0081440 A1* | 3/2025 | Han | H10D 64/514 |

FOREIGN PATENT DOCUMENTS

| | | |
|---|---|---|
| CN | 112992792 A | 6/2021 |
| CN | 113035869 A | 6/2021 |
| CN | 113611671 A | 11/2021 |
| CN | 114420644 A | 4/2022 |

OTHER PUBLICATIONS

European Patent Office, Extended European Search Report Issued in Application No. 22888619.8, May 27, 2024, Germany, 10 pages.

* cited by examiner

SEMICONDUCTOR STRUCTURE AND MANUFACTURING METHOD THEREOF

This is a continuation of International Application No. PCT/CN2022/137301, filed on Dec. 7, 2022, which claims the priority to Chinese Patent Application No. 202210016563.4, titled "SEMICONDUCTOR STRUCTURE AND MANUFACTURING METHOD THEREOF", and filed on Jan. 7, 2022. The entire contents of International Application No. PCT/CN2022/137301 and Chinese Patent Application No. 202210016563.4 are incorporated herein by reference.

TECHNICAL FIELD

Embodiments of the present disclosure relate to, but are not limited to, a semiconductor structure and a manufacturing method thereof.

BACKGROUND

As an integration density of a dynamic memory develops towards a higher direction, while studying arrangement of transistors in a dynamic memory array structure and how to reduce sizes of a single functional device in the dynamic memory array structure, it is also necessary to improve electrical properties of small-size functional devices.

When a vertical gate-all-around (GAA) transistor structure is configured as a dynamic memory access transistor, an area occupied thereby may reach 4F2 (F: a minimum pattern size that may be obtained under given process conditions), such that higher density efficiency may be achieved in principle. However, due to reduction of a spacing between adjacent bit lines, the size of an isolation layer between the adjacent bit lines is also reduced, and the impact of a coupling capacitance between the adjacent bit lines on the electrical properties of a semiconductor structure increases.

SUMMARY

An overview of the subject matter detailed in the present disclosure is provided below, which is not intended to limit the protection scope of the claims.

Embodiments of the present disclosure provide a semiconductor structure and a manufacturing method thereof.

According to some embodiments of the present disclosure, one aspect of the embodiments of the present disclosure provides a method of manufacturing a semiconductor structure. The manufacturing method includes: providing a base; forming a plurality of first trenches extending along a first direction in the base, the first trenches forming the base into semiconductor layers arranged at intervals, and filling the first trenches with a first isolation layer; forming a plurality of second trenches extending along a second direction in the semiconductor layers and the first isolation layer, to form the semiconductor layers into a plurality of separate semiconductor pillars and initial bit lines located below the semiconductor pillars, a depth of the second trench being smaller than a depth of the first trench; forming third trenches parallel to the first trenches at positions lower than the second trenches, a width of the third trench being greater than a width of the second trench in a direction perpendicular to a side wall of the semiconductor pillar; and filling the second trenches and the third trenches with a second isolation layer, wherein a part of the second isolation layer in the third trenches has gaps.

According to some embodiments of the present disclosure, another aspect of the embodiments of the present disclosure further provides a semiconductor structure. The semiconductor structure includes: a base, including a plurality of semiconductor layers arranged at intervals and a first isolation layer located between adjacent semiconductor layers, the semiconductor layers including bit lines extending along a first direction and semiconductor pillars located on top surfaces of the bit lines, the first isolation layer being located on side walls of one ends of the semiconductor pillars close to the bit lines and located between adjacent bit lines, third trenches being provided between a part of the first isolation layer located between the adjacent bit lines and a part of the first isolation layer located on the side walls of the one ends of the semiconductor pillars, the third trenches being arranged at intervals along a second direction, and the second direction being different from the first direction; and a second isolation layer, located on the side walls of the one ends of the semiconductor pillars close to the bit lines and surfaces of the bit lines exposed by the third trenches, a part of the second isolation layer located in the third trenches having gaps.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

REFERENCE NUMERALS

100. Base; 101. Semiconductor layer; 113. First trench; 102. First isolation layer; 104. Initial bit line; 105. Semiconductor pillar; 123. Second trench; 133. Third trench; 132. Second isolation layer; 112. Third isolation layer; 109. Barrier layer; 114. Bit line; 115. Polysilicon layer; 117. Insulating layer; 118. Gate dielectric layer; 122. Fourth isolation layer; 124. Metal semiconductor compound; 125. Protective layer; 127. Dielectric layer; 128. Word line; 143. Gap; 153. Spacing; 163. Through hole; I. First doped region; II. Channel region; and III. Second doped region.

DETAILED DESCRIPTION

The technical solutions in the embodiments of the present disclosure are described below clearly and completely referring to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

The embodiments of the present disclosure provide a semiconductor structure and a manufacturing method thereof. In the manufacturing method, third trenches are formed between adjacent initial bit lines in advance, such that when a second isolation layer is formed subsequently, gaps are provided in a region of a part of the second isolation layer corresponding to the third trenches. The relative dielectric constant of air in the gap is far smaller than that of the second isolation layer, thereby facilitating the reduction of parasitic capacitance between the adjacent initial bit lines, and reducing the influence between semiconductor pillars electrically connected to different initial bit lines to improve overall electrical properties of the semiconductor structure.

An embodiment of the present disclosure provides a method of manufacturing a semiconductor structure. The method of manufacturing a semiconductor structure provided by an embodiment of the present disclosure is described in detail below referring to the accompanying drawings. FIG. 1 to FIG. 24 are schematic structural diagrams corresponding to a method of manufacturing a semiconductor structure according to an embodiment of the present disclosure. It should be noted that to conveniently describe and clearly illustrate the manufacturing method of a semiconductor structure, FIG. 1 to FIG. 24 in this embodiment are all schematic partial structural diagrams of the semiconductor structure.

Figure 3:
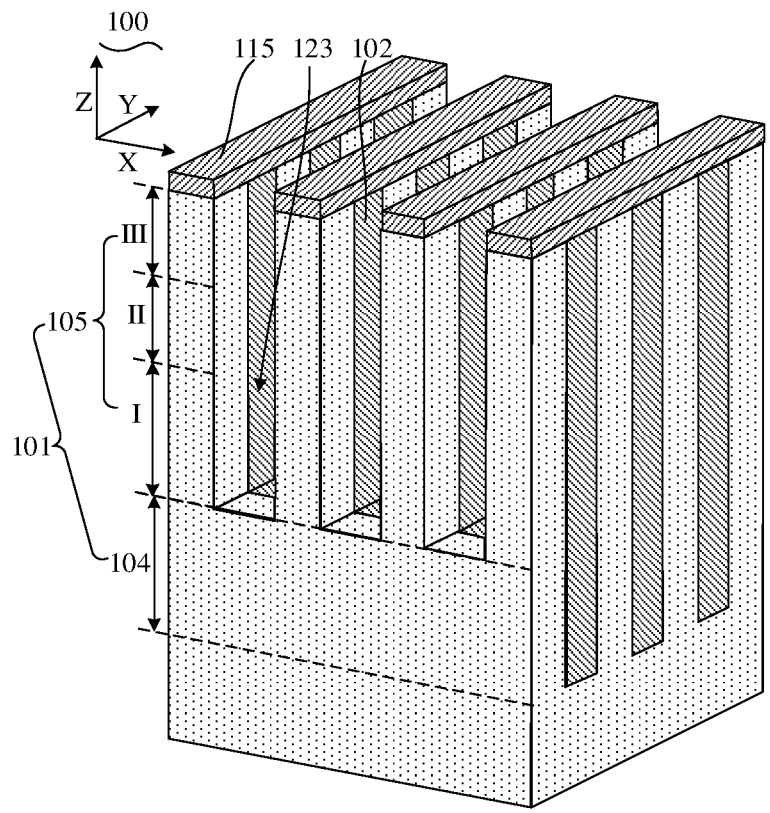
Figure 4:
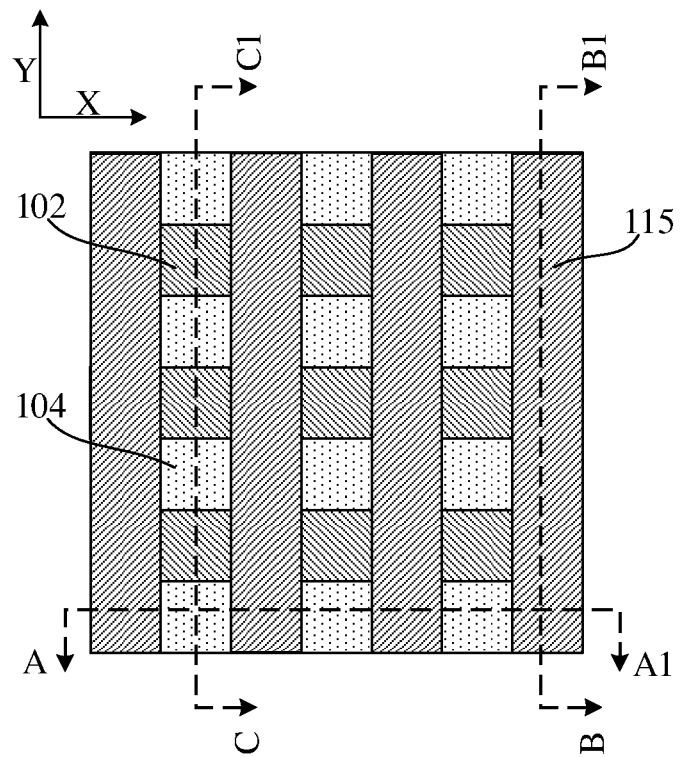
Figure 5:
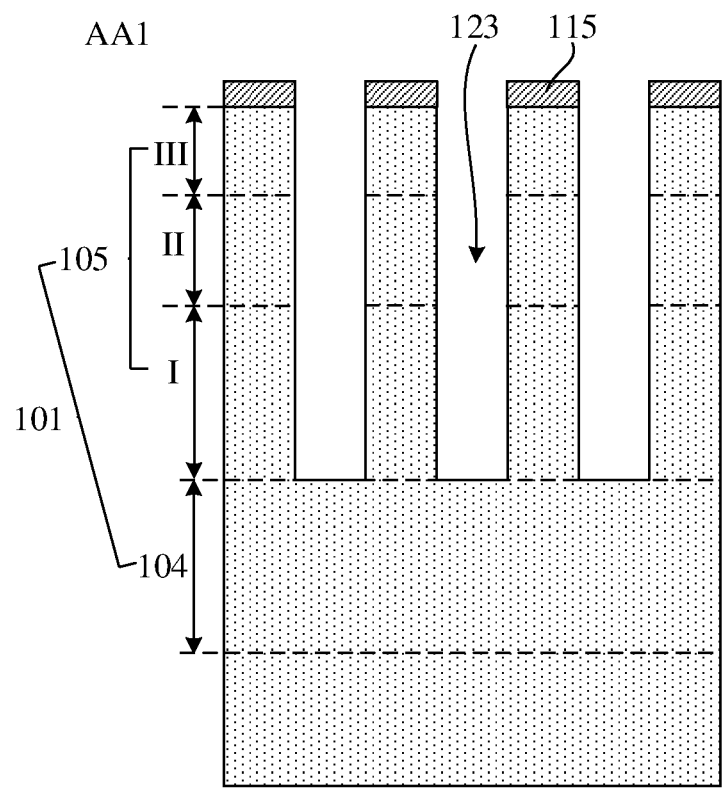
Figure 6:
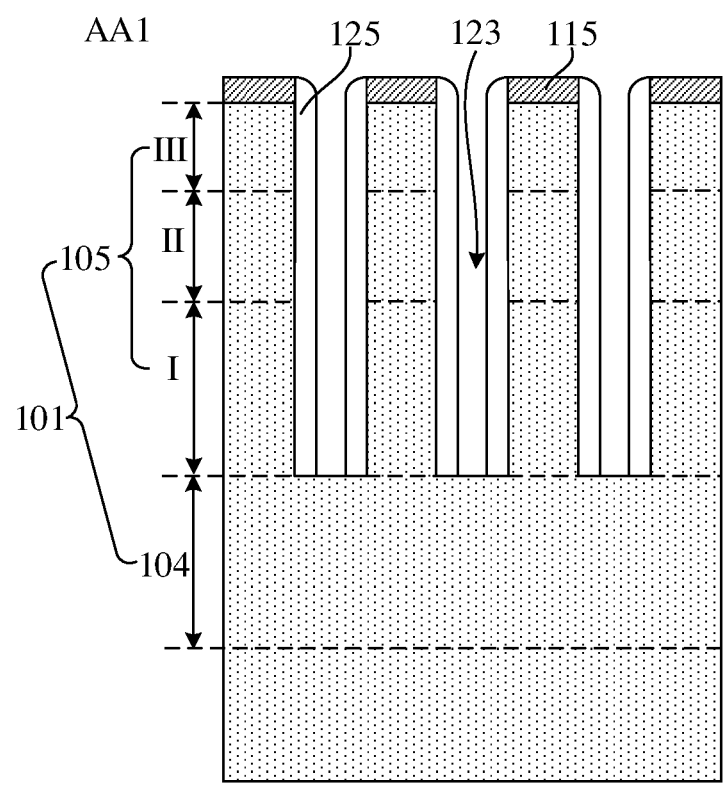
Figure 7:
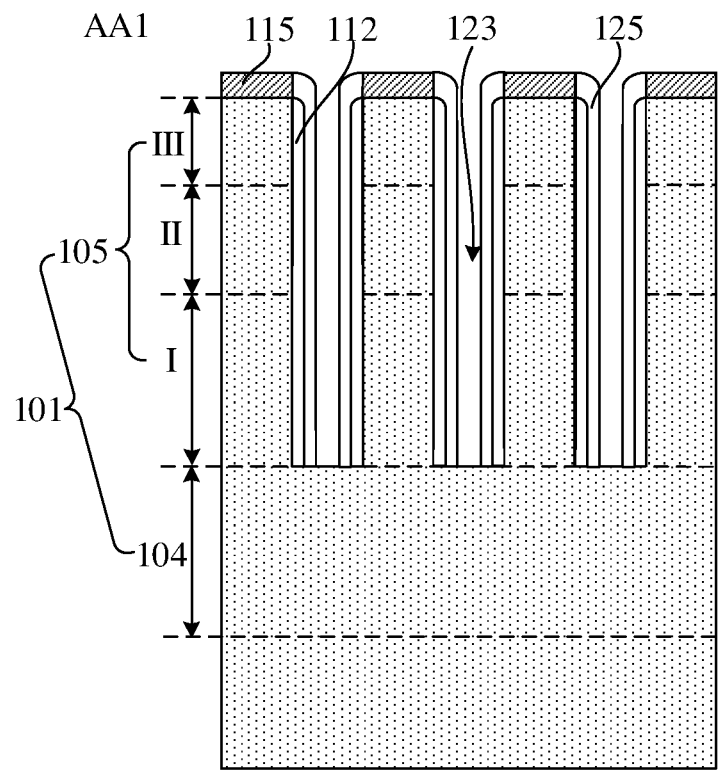
Figure 8:
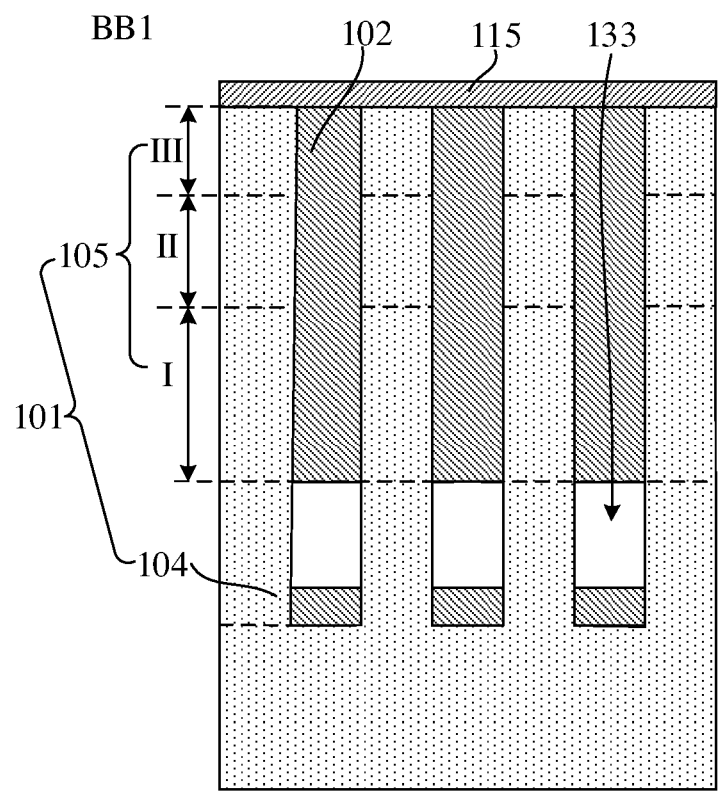
Figure 9:
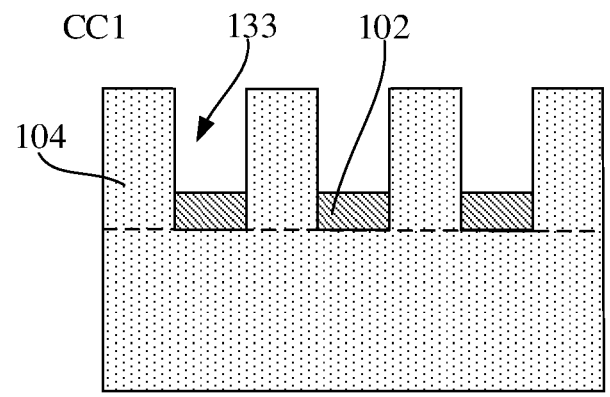

FIG. 4 is a top view of the structure shown in FIG. 3. FIG. 5 is a schematic cross-sectional view of the structure shown in FIG. 4 along a first sectional direction AA1. FIG. 6 and FIG. 7 are schematic cross-sectional views of an intermediate structure formed subsequently along a first sectional direction AA1. FIG. 8 is a schematic cross-sectional view of an intermediate structure formed subsequently along a second sectional direction BB1. FIG. 9 is a schematic cross-sectional view of an intermediate structure formed subsequently along a third sectional direction CC1. It should be noted that one or two or three of the schematic cross-sectional views along the first cross-sectional direction AA1, the second cross-sectional direction BB1, and the third sectional direction CC1 are set according to the needs of the presentation.

Figure 1:
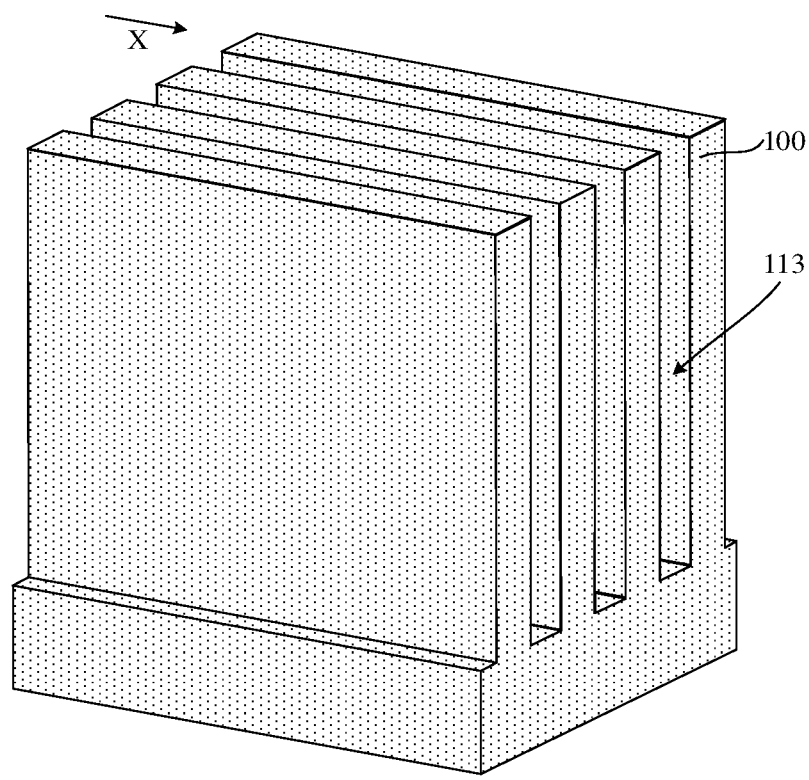
FIG. 1 to FIG. 24 are schematic structural diagrams corresponding to a method of manufacturing a semiconductor structure according to an embodiment of the present disclosure.
Figure 2:
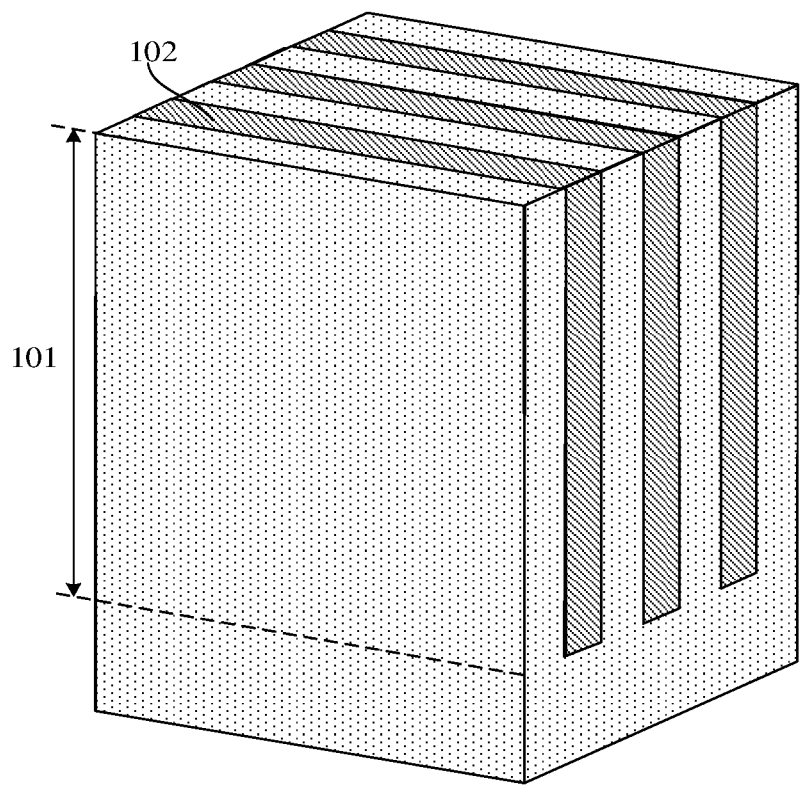

As shown in FIG. 1 and FIG. 2, a base 100 is provided; a plurality of first trenches 113 extending along a first direction X are formed in the base 100, the first trenches 113 forming the base 100 into semiconductor layers 101 arranged at intervals; and a first isolation layer 102 is filled in the first trenches 113.

In some embodiments, the providing a base 100 includes:
providing an initial base, where the initial base may be made of an elemental semiconductor material or a crystalline inorganic compound semiconductor material. The elemental semiconductor material may be silicon or germanium; and the crystalline inorganic compound semiconductor material may be silicon carbide, silicon germanium, gallium arsenide, indium gallium or the like.

The initial base is doped and annealed, such that the initial base is doped with N-type ions or P-type ions for subsequent formation of initial bit lines and semiconductor pillars on the basis of the initial base. The N-type ions may be at least one of arsenic ions, phosphorous ions, or antimony ions; and the P-type ions may be at least one of boron ions, indium ions, or gallium ions.

As shown in FIG. 1, a first mask layer (not shown in the figure) is formed on the initial base. The first mask layer is provided with a plurality of separate first openings, the first openings extend along the first direction X, and the first openings are as long as the initial bit lines 104 formed subsequently.

The initial base is etched by taking the first mask layer as a mask to form a plurality of first trenches 113.

As shown in FIG. 2, the first mask layer is removed to perform a deposition process to form a first isolation film covering the top surface of the initial base and filling the first trenches 113; and chemical mechanical planarization is performed on the first isolation film until the top surface of the initial base is exposed, to form a first isolation layer 102.

As shown in FIG. 3 to FIG. 5, a plurality of second trenches 123 extending along a second direction Y are formed in the semiconductor layers 101 and the first isolation layer 102, to form the semiconductor layers 101 into a plurality of separate semiconductor pillars 105 and initial bit lines 104 located below the semiconductor pillars 105, a depth of the second trench 123 being smaller than a depth of the first trench 113.

Still referring to FIG. 3 to FIG. 5, in some embodiments, the forming semiconductor pillars 105 and initial bit lines 104 includes:
forming a second mask layer (not shown in the figures) on a top surface commonly formed by the first isolation layer 102 and the remaining part of the initial base, the second mask layer being provided with a plurality of separate second openings, the second openings extending along the second direction Y, and the second openings being as long as word lines formed subsequently.

The initial base and the first isolation layer 102 are etched by taking the second mask layer as a mask. It should be noted that after the semiconductor pillars 105 and the initial bit lines 104 are formed, the first isolation layer 102 is located not only in intervals between the adjacent initial bit lines 104, but also in intervals between the adjacent semiconductor pillars 105.

In a direction Z, a height of the second trench 123 is smaller than a height of the first trench 113 (as shown in FIG. 1), such that when the initial bit lines 104 are formed, a plurality of separate semiconductor pillars 105 are formed on one sides of the initial bit lines 104, and the initial bit lines 104 are in contact with the first doped regions I of the semiconductor pillars 105. The second mask layer is removed.

Figure 14:
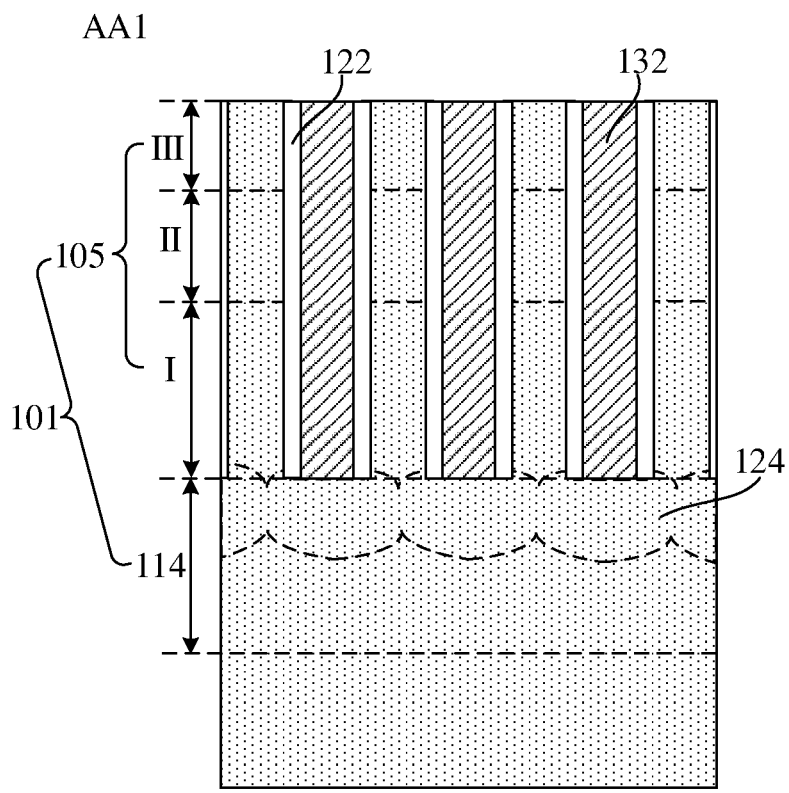

In the direction perpendicular to the side wall of the semiconductor pillar 105, namely in the direction X in FIG. 3, a width of the first trench 113 is greater than or as wide as a width of the second trench 123 (as shown in FIG. 4). It is ensured that when third trenches 133 (as shown in FIG. 8) are formed subsequently, the openings of the second trenches 123 are always smaller than those of the third trenches 133, such that when the second isolation layer 132 (as shown in FIG. 14) is formed subsequently, the second isolation layer 132 having gaps is formed in corresponding regions of the third trenches 133. In some embodiments, the ratio of the width of the first trench 113 to the width of the second trench 123 may be 1.5 to 2.

The method of forming the initial bit lines 104, the semiconductor pillars 105, and the first isolation layer 102 includes self-aligned quadruple patterning (SAQP) or self-aligned double patterning (SADP).

As shown in FIG. 3 and FIG. 5, the second trenches 123 are arranged at intervals along the first direction X; and in the direction Z of pointing to the top of the second trench 123 along the bottom of the second trench 123, the semiconductor layer 101 includes the initial bit line 104 and the semiconductor pillars 105 arranged in sequence, and the semiconductor pillar 105 includes a first doped region I, a channel region II, and a second doped region III arranged in sequence. It should be noted that the first doped region I and the second doped region III may all be configured as a source or a drain of subsequently formed GAA transistor having the semiconductor layer 101, and the channel region II corresponds to a gate dielectric layer of the GAA transistor and the word line. In some embodiments, the initial bit lines 104 are prepared for the formation of bit lines by means of metal silicidation.

As shown in FIG. 3 and FIG. 4, in some embodiments, the first direction X is perpendicular to the second direction Y, such that the formed semiconductor layers 101 present arrangement of 4F2 (F: a minimum pattern size that may be obtained under given process conditions), which is beneficial to increase the integration density of the semiconductor structure. In other embodiments, the first direction intersects with the second direction, and an included angle between the two may be, for example, 80°, 85°, 100°, or 120°.

It should be noted that a plurality of initial bit lines 104 arranged at intervals are provided in the semiconductor layers 101, and each initial bit line 104 may be in contact with at least one first doped region I. In FIG. 1, by taking an example where there are four initial bit lines 104 arranged at intervals, and each initial bit line 104 is in contact with four first doped regions I, in practical applications, the number of initial bit lines 104 and the number of first doped regions I in contact with each initial bit line 104 may be reasonably set according to actual electrical requirements.

A device formed by the semiconductor pillar 105 may be a junctionless transistor. That is, the first doped region I, the channel region II, and the second doped region III are doped with the same type of ions. The "junctionless" refers to no PN junction. That is, the first doped region I, the channel region II, and the second doped region III are doped with ions of the same concentration. In this way, there is no need to perform additional doping in the first doped region I and the second doped region III, thereby avoiding the problem that the doping process in the first doped region I and the second doped region III is difficult to control. Especially as the size of the transistor is further reduced, if the first doped region I and the second doped region III are additionally doped, the doping concentration may become more difficult to control. In addition, since the device is a junctionless transistor, it is beneficial to avoid the phenomenon of fabricating ultra-steep PN junctions within a nanometer scale by means of an ultra-steep source-drain concentration gradient doping process, the problems such as threshold voltage drift and leakage current increase caused by doping mutations may be avoided, it is also beneficial to suppress the short-channel effect, and it is helpful to further improve the integration density and electrical properties of the semiconductor structure. It can be understood that the additional doping herein refers to doping to make the type of the ions doped in the first doped region I and the second doped region III different from that of the ions doped in the channel region II.

Still referring to FIG. 1 to FIG. 5, in this embodiment, the initial bit lines 104 and the semiconductor layers 101 are all formed by etching the initial base. That is, the initial bit lines 104 and the semiconductor layers 101 are formed by using a same film layer structure, such that the initial bit lines 104 and the semiconductor layers 101 are integrated, thereby improving an interface state defect between the initial bit lines 104 and the semiconductor layers 101, and improving the performance of the semiconductor structure.

As shown in FIG. 1 to FIG. 5, in some embodiments, a polysilicon layer 115 is further provided on the top surfaces of the semiconductor pillars 105 distant from the initial bit lines 104; and in other embodiments, there may be no polysilicon layer on the top surfaces of the semiconductor pillars 105. That is, the top surfaces of the semiconductor pillars 105 may also be exposed outside.

As shown in FIG. 3 and FIG. 6 to FIG. 9, the third trenches 133 parallel to the first trenches 113 (as shown in FIG. 1) are formed at positions lower than the second trenches 123, in the direction perpendicular to the side wall of the semiconductor pillar 105, namely in the direction X in FIG. 3, a width of the third trench 133 being greater than a width of the second trench 123. It is beneficial to form gaps in a region of a part of the second isolation layer 132 corresponding to the third trenches 133 when the second isolation layer 132 (as shown in FIG. 14) fills the second trenches 123 and the third trenches 133.

In some embodiments, the forming third trenches 133 parallel to the first trenches 113 at positions lower than the second trenches 123 includes:

as shown in FIG. 6, form a protective layer 125, the protective layer 125 being located on side walls of the second trenches 123, and exposing top surfaces of the initial bit lines 104 and a top surface of a part of the first isolation layer 102 between the adjacent initial bit lines 104. It should be noted that when the polysilicon layer 115 is provided on the top surfaces of the semiconductor pillars 105, the protective layer 125 may further be located on the side wall of the polysilicon layer 115.

It should be noted that in some embodiments, as shown in FIG. 6, the protective layer 125 is located on the side wall surfaces of the second trenches 123. The protective layer 125 may be formed by using: performing a deposition process to form a protective film covering the side walls and bottoms of the second trenches 123 and the top surfaces of the semiconductor pillars 105; and performing etching, such as vertical dry etching on the protective film to expose partial bottom surfaces of the second trenches 123, namely partial top surfaces of the initial bit lines 104, the remaining part of the protective film serving as the protective layer 125. The protective film is made of silicon nitride.

In other embodiments, as shown in FIG. 7, before the protective layer 125 is formed, the manufacturing method may further include: form a third isolation layer 112, the third isolation layer 112 being located only on exposed side wall surfaces of the second trenches 123. The third isolation layer 112 and the protective layer 125 may be formed by using: first forming the third isolation layer 112 on the side wall surfaces of the semiconductor pillars 105, and then performing a deposition process to form a protective film covering the surface of the third isolation layer 112, the bottom surfaces of the second trenches 123, and the top surfaces of the semiconductor pillars 105; and performing etching, such as vertical dry etching on the protective film to expose partial bottom surfaces of the second trenches 123, namely partial top surfaces of the initial bit lines 104 and the first isolation layer 102, the remaining part of the protective film serving as the protective layer 125. The protective film is made of silicon nitride, and the third isolation layer 112 is made of silicon oxide. When it is required to perform metal silicidation on the initial bit lines 104 subsequently, the third isolation layer 112 may be configured to protect the semiconductor pillars 105 to prevent the semiconductor pillars 105 from being subjected to the metal silicidation.

In above two embodiments, as shown in FIG. 6, FIG. 8, and FIG. 9, or as shown in FIG. 7 to FIG. 9, a part of the first isolation layer 102 located on the side walls of the initial bit lines 104 is partially removed by a certain thickness by taking the protective layer 125 as a mask, to form the third trenches 133 between the adjacent initial bit lines 104 to prepare for subsequent formation of gaps between the adjacent initial bit lines 104. Because the material of the protective layer 125 is different from the material of the first isolation layer 102, a wet etching process may be used to partially remove the part of the first isolation layer 102 located on the side walls of the initial bit lines 104 by a certain thickness by starting from partial top surface of the first isolation layer 102 exposed by the protective layer 125.

Under a same etching process, the etch selectivity between the first isolation layer 102 and the protective layer 125 may be greater than equal to 50, such as 60, 70, and 100. Or, no etching occurs, such that when the part of the first isolation layer 102 located on the side walls of the initial bit lines 104 is partially removed by a certain thickness, the protective layer 125 and the structure covered by the protective layer 125 are less or not etched.

For example, the protective layer 125 may be removed. It should be noted that in the removing the protective layer 125, the polysilicon layer 115 may also be removed. When there is a third isolation layer 112 between the side walls of the semiconductor pillars 105 and the protective layer 125, in some embodiments, the third isolation layer 112 may also be removed together in the removing the protective layer 125. In other embodiments, the third isolation layer 112 may be removed after the subsequent performing metal silicidation on the initial bit lines 104, such that the semiconductor pillars 105 are protected by the third isolation layer 112 when the initial bit lines are subjected to the metal silicidation.

In the direction perpendicular to the side wall of the semiconductor pillar 105, a width of the third trench 133 is greater than a width of the second trench 123. When a width of the third trench 133 is greater than a width of the second trench 123, the second trench 123 is narrow, such that in the subsequent forming the second isolation layer 132 (as shown in FIG. 14), when the second isolation layer 132 does not fills the third trenches 133, the second isolation layer 132 is sealed, and gaps are formed in the region of the part of the second isolation layer 132 corresponding to the third trenches 133. The ratio of a width of the formed third trench 133 to a width of the second trench 123 may be 1.1 to 4, such as 1.5, 2, 3.5, and 4.

Figure 10:
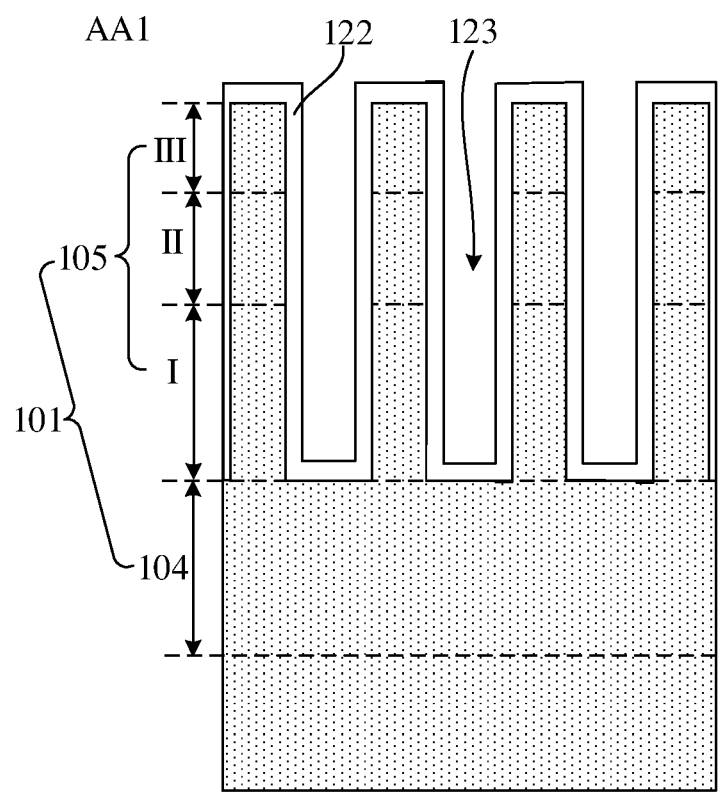
Figure 11:
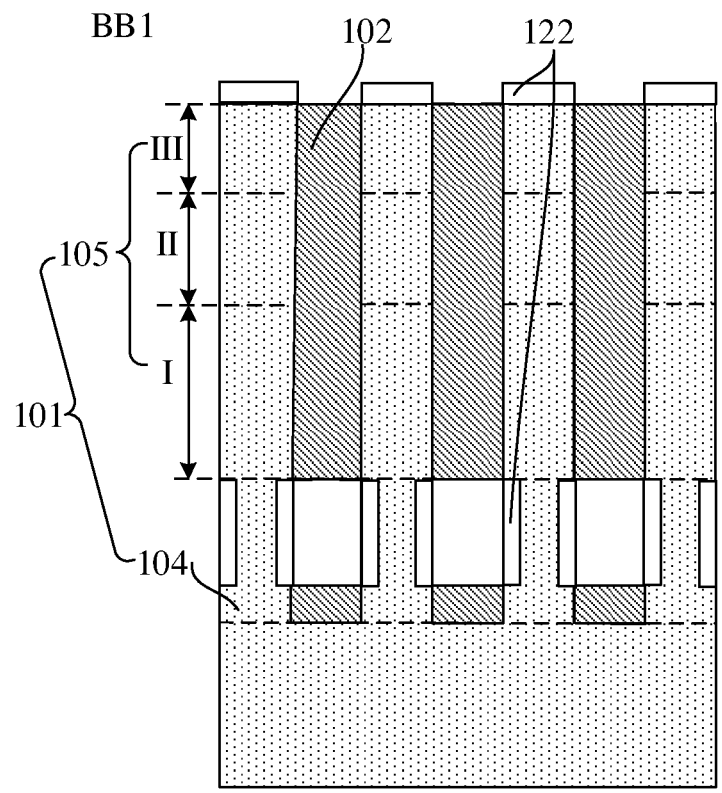
Figure 12:
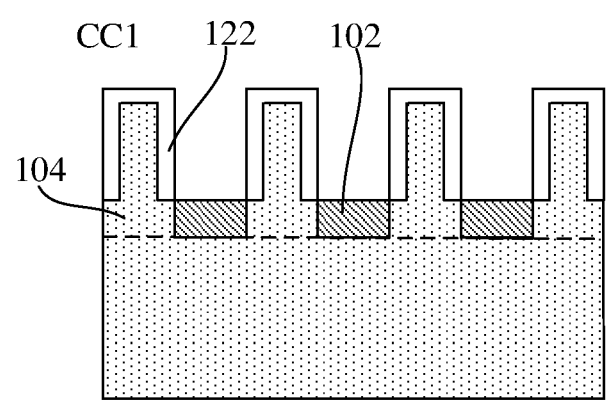

In some embodiments, after the forming third trenches 133 and before forming the second isolation layer 132 subsequently, the manufacturing method may further include:

as shown in FIG. 10 to FIG. 12, after the third trenches 133 are formed, form a fourth isolation layer 122 on the surfaces of the semiconductor layers 101 exposed by the third trenches 133, where the fourth isolation layer 122 does not change an overall morphology of the third trenches 133.

It should be noted that the protective layer 125 and the polysilicon layer 115 are removed after the third trenches 133 are formed. In some embodiments, in the forming the fourth isolation layer 122 shown in FIG. 12 to FIG. 14, the third isolation layer 112 is also removed. That is, the fourth isolation layer 122 not only surrounds the exposed side wall surfaces of the initial bit lines 104, but also is located on the top surfaces and partial exposed side walls of the semiconductor pillars 105. In other embodiments, when the third isolation layer is not removed, the fourth isolation layer surrounds the exposed side wall surfaces of the initial bit lines and is located on the top surfaces of the semiconductor pillars.

In above two embodiments, the fourth isolation layer 122 may all be formed by thermally oxidizing the exposed surfaces of the semiconductor layers 101. The fourth isolation layer 122 is configured for protecting the remaining parts of the semiconductor layers 101 when the top surfaces of the initial bit lines 104 are subjected to the metal silicidation, thereby preventing the remaining parts of the semiconductor layers 101 from being affected by the metal silicidation. The remaining parts of the semiconductor layers 101 are subjected to the metal silicidation, thereby avoiding metal materials, in addition to insulating materials, between the adjacent semiconductor layers 101, avoiding an excessive parasitic capacitance between the adjacent semiconductor layers 101, and reducing the electrical properties of the semiconductor structure. The semiconductor layers 101 may be made of silicon, and the fourth isolation layer 122 may be made of silicon oxide.

Figure 13:
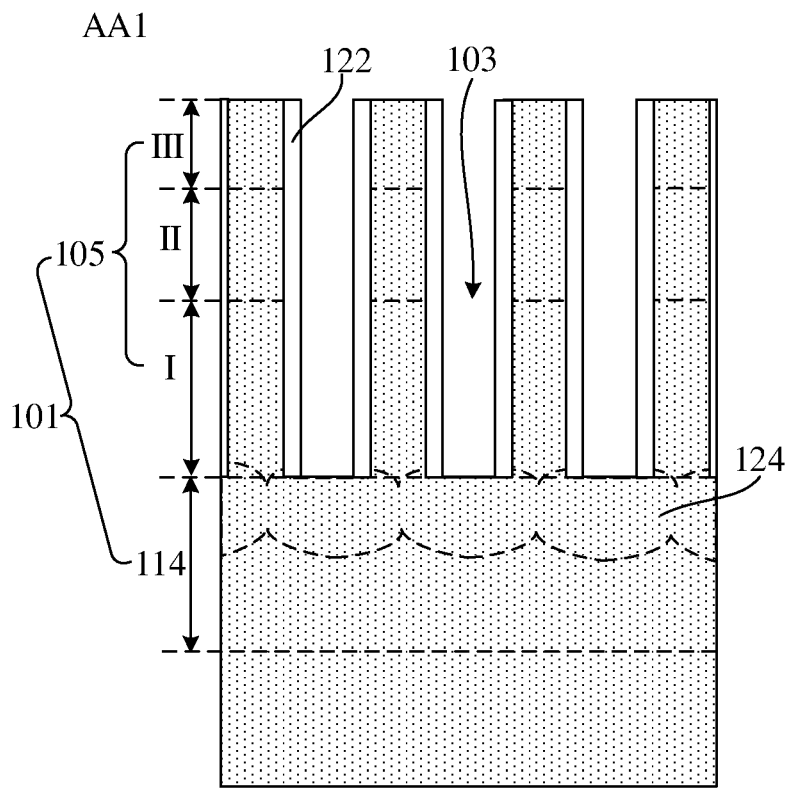

In some embodiments, after forming the fourth isolation layer 122 and before the forming the second isolation layer 132 subsequently, the manufacturing method may further include:

as shown in FIG. 13, removing a part of the fourth isolation layer 122 located on the top surfaces of the initial bit lines 104 (as shown in FIG. 10). It should be noted that in some embodiments, in the removing the part of the fourth isolation layer 122 located on the top surfaces of the initial bit lines 104, a part of the fourth isolation layer 122 located on the top surfaces of the semiconductor pillars 105 is also removed. In other embodiments, the part of the fourth isolation layer 122 located on the top surfaces of the semiconductor pillar may also be retained.

Still referring to FIG. 10 and FIG. 13, the exposed parts of the initial bit lines 104 are subjected to the metal silicidation to form bit lines 114. The material of the bit line 114 includes a metal semiconductor compound 124.

In some embodiments, the metal silicidation includes: forming a metal layer (not shown in the figures) on the fourth isolation layer 122, partial top surfaces of the initial bit lines 104, and partial top surface of the first isolation layer 102; performing annealing treatment such that the metal layer is reacted with the initial bit lines 104 to form the bit lines 114; and removing the remaining unreacted part of the metal layer.

In other embodiments, the metal silicidation includes: directionally doping metal elements in the exposed top surfaces of the initial bit lines 104, and then performing annealing, which is beneficial to avoid the situation where the metal semiconductor compound 124 is formed in other places and needs to be removed.

In some embodiments, in a direction of the semiconductor pillar 105 pointing to the bit line 114, a depth of the third trench 133 is greater than a depth of the metal semiconductor compound 124.

It should be noted that in some embodiments, regions of the initial bit lines 104 below the first doped regions I are made of a semiconductor material, and partial regions of the initial bit lines 104 that are not covered by the first doped regions I are made of a metal semiconductor compound. It may be understood that as the size of the device continues to shrink or the manufacturing process parameters are adjusted, partial regions of the initial bit lines 104 below the first doped regions I are made of a semiconductor material, and the remaining regions of the initial bit lines 104 below the first doped regions I may also be made of a metal semiconductor compound. The "remaining regions" herein are located at the peripheries of the "partial regions".

As shown in FIG. 13, a plurality of metal semiconductor compounds 124 in the semiconductor layer 101 are communicated with each other to form a part of the bit line 114. In other embodiments, a plurality of metal semiconductor compounds in a same bit line may also be spaced from each other. It should be noted that regions of the semiconductor layers 101 defined by dotted line boxes similar to ellipses in FIG. 13 are the metal semiconductor compounds 124, and in practical applications, the sizes of contact regions between the adjacent metal semiconductor compounds 124 are not limited. In other embodiments, a total thickness of the initial bit line 104 may be converted to the metal semiconductor compounds 124.

In other embodiments, when the top surfaces of the second doped regions III are exposed outside, and are not protected by a grinding layer, the manufacturing method may further include: perform metal silicidation on the top surfaces of the second doped regions III. In this way, when the bottom electrode of capacitor structure is subsequently formed on the top surface of the second doped region III, the second doped region III is in ohmic contact with the bottom electrode. Thus, the bottom electrode is prevented from being in direct contact with the semiconductor materials to form Schottky barrier contact. The ohmic contact reduces the contact resistance between the second doped region III and the bottom electrode, thereby reducing the energy consumption of the semiconductor structure during working, and improving a resistive-capacitive (RC) delay effect to improve the electrical properties of the semiconductor structure. The top surfaces of the initial bit lines 104 and the top surfaces of the second doped regions III may be subjected to the metal silicidation in a same process step, thereby simplifying the process step. In other embodiments, the metal silicidation on the top surfaces of the initial bit lines 104 and the top surfaces of the second doped regions III may also be performed in steps.

In the above embodiments, by taking an example where the semiconductor layers 101 are made of silicon, the material of the metal layer or the material of the directionally doped metal elements may include at least one of cobalt, nickel, molybdenum, titanium, tungsten, tantalum, or platinum, and the material of the metal semiconductor compound 124 includes at least one of cobalt silicide, nickel silicide, molybdenum silicide, titanium silicide, tungsten silicide, tantalum silicide, or platinum silicide. The metal semiconductor compound 124 has a relatively lower resistivity compared with unmetallized semiconductor materials, and the bit line 114 has a lower resistivity compared with unmetallized initial bit line 104. Thus, it is beneficial to reduce the resistance of the bit line 114 and the contact resistance between the bit line 114 and the first doped region I, and further improve the electrical properties of the semiconductor structure.

Figure 15:
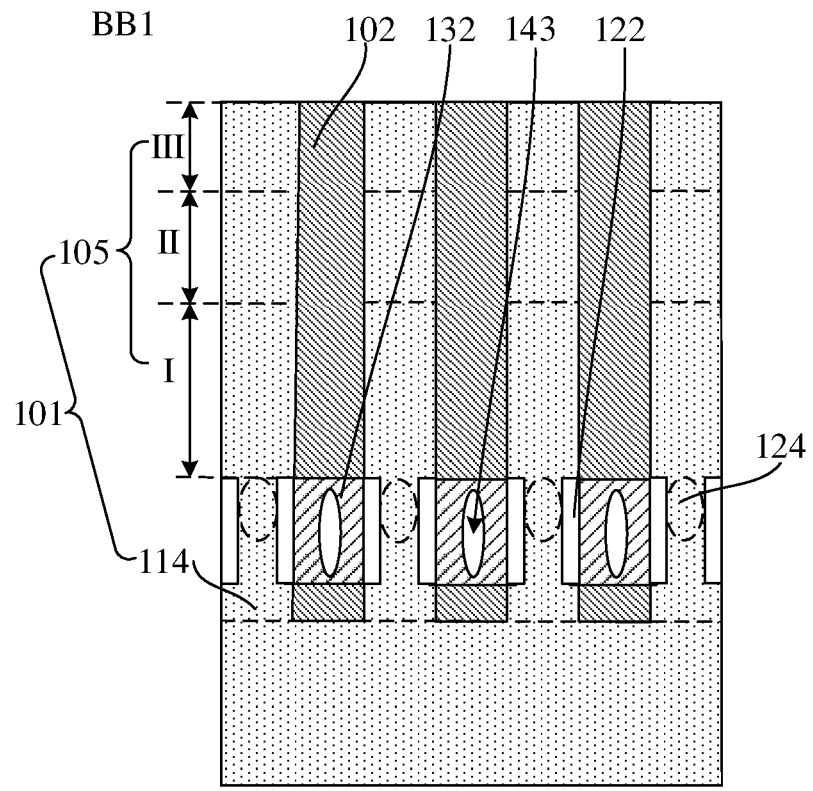
Figure 16:
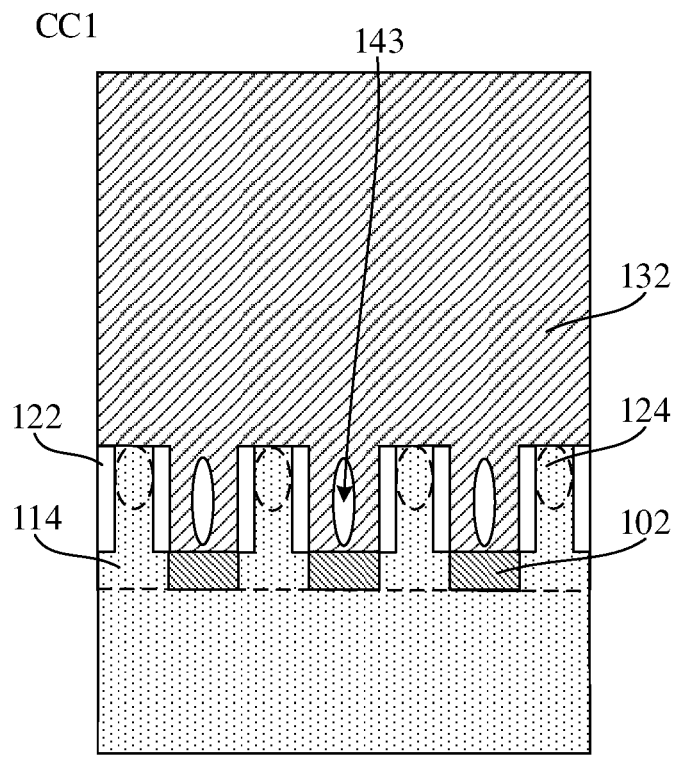
Figure 17:
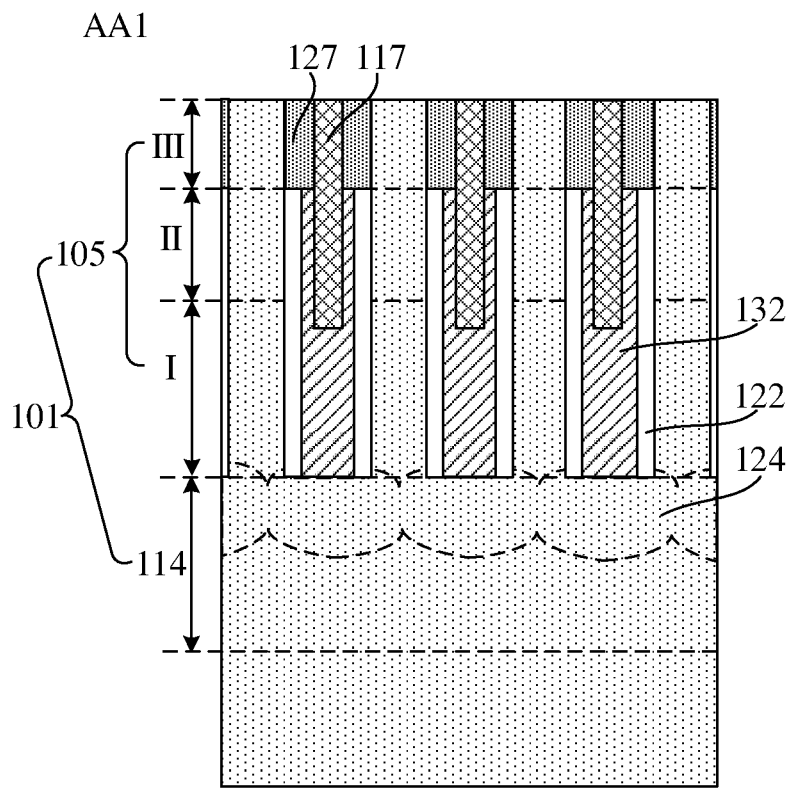

As shown in FIG. 14 to FIG. 16, the second isolation layer 132 fills the second trenches 123 (as shown in FIG. 3) and the third trenches 133 (as shown in FIG. 8), where a part of the second isolation layer 132 in the third trenches 133 has gaps 143. The method of forming the second isolation layer 132 having the gaps 143 includes the deposition process. In the direction perpendicular to the side wall of the semiconductor pillar 105, namely in the direction X, a width of the third trench 133 is greater than a width of the second trench 123. Therefore, in the depositing the second isolation layer 132, when the deposition material for forming the second isolation layer 132 does not filling the third trenches 133, seals are formed above the gaps 143, such that the gaps 143 are formed in the second isolation layer 132. The relative dielectric constant of air in the gap 143 is far smaller than that of the second isolation layer 132, that is, the insulativity of the air is superior to that of the second isolation layer 132, which is conducive to reducing the parasitic capacitance between the adjacent bit lines 114, and reducing the affect between the semiconductor pillars 105 electrically connected to different bit lines 114 to improve the overall electrical properties of the semiconductor structure.

In some embodiments, as shown in FIG. 17 to FIG. 20, the manufacturing method may further include: partially removing a part of the second isolation layer 132 in the second trenches 123 (as shown in FIG. 3) by a certain thickness to form grooves (not shown in the figures), the groove extending along the second direction Y; forming an insulating layer 117 filling the grooves; and partially removing a part of the first isolation layer 102 and a part of the second isolation layer 132 on the side walls of the semiconductor pillars 105 by a certain thickness by taking the insulating layer as a mask, to form a spacing 153 between the semiconductor pillars 105 and the insulating layer 117.

The gate dielectric layer and the word lines are subsequently formed on the basis of the spacing 153, the gate dielectric layer and the word lines with accurate sizes may be formed in the gaps 143 by means of self-aligning, and the gate dielectric layer and the word lines with high size accuracy may be formed without using an etching process, thereby simplifying the formation of the gate dielectric layer and the word lines. Moreover, the gate dielectric layer and the word lines with small sizes may be obtained by adjusting the size of the gap 143.

The method of forming the grooves includes graphical processing, and the side walls of the grooves are composed of the remaining part of the second isolation layer 132. In a direction of the first doped region I pointing to the channel region II, the depth of the groove is greater than or equal to the sum of the height of the channel region II and the height of the second doped region III. That is, the bottom surface of the insulating layer 117 close to the bit lines 114 are not higher than the top surfaces of the first doped regions I distant from the bit lines 114. It should be noted that in actual applications, the maximum depth of the insulating layer 117 may be equal to the depth of the semiconductor pillar 105. The insulating layer 117 is made of silicon nitride.

In other embodiments, when there is also a third isolation layer 112 between the side walls of the semiconductor pillars 105 and the second isolation layer 132, and the second isolation layer 132 is patterned to form the grooves, a part of the second isolation layer 132 corresponding to the depth of the groove is removed by a certain thickness, and the side walls of the grooves may also be composed of the remaining part of the third isolation layer 112.

In some embodiments, the forming a spacing 153 may include:
    as shown in FIG. 17 to FIG. 20, removing a part of the first isolation layer 102 and a part of the second isolation layer 132 corresponding to the second doped regions III by taking the insulating layer as the mask; forming a dielectric layer 127, the dielectric layer 127 surrounding side walls of the second doped regions III and being located on a side wall of the insulating layer 117, a side wall of the dielectric layer 127 defining a through hole 163, a bottom of the through hole 163 exposing the first isolation layer 102, and a material of the dielectric layer 127 and a material of the insulating layer 117 being both different from a material of the first isolation layer 102.

The insulating layer 117 and the dielectric layer 127 may both be made of silicon nitride, and the first isolation layer 102 and the second isolation layer 132 may both be made of silicon oxide. Because there is high etch selectivity between the silicon nitride and the silicon oxide for the same etching process, the first isolation layer 102 and the second isolation layer 132 may be subsequently etched, by taking the structure commonly formed by the insulating layer 117 and the dielectric layer 127 as a mask, to form the spacing 153.

Figure 18:
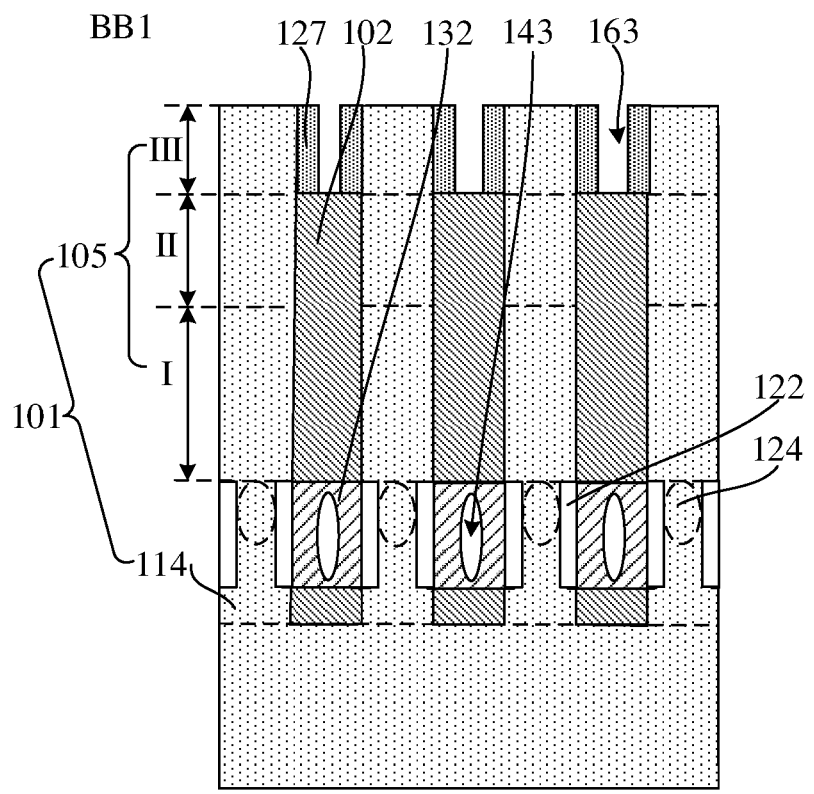
Figure 19:
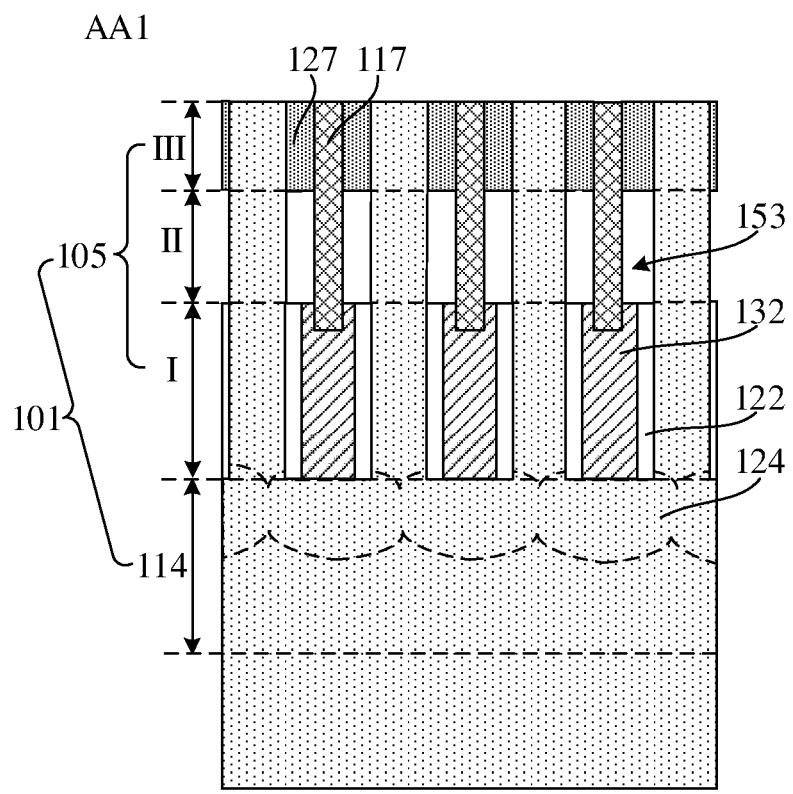
Figure 20:
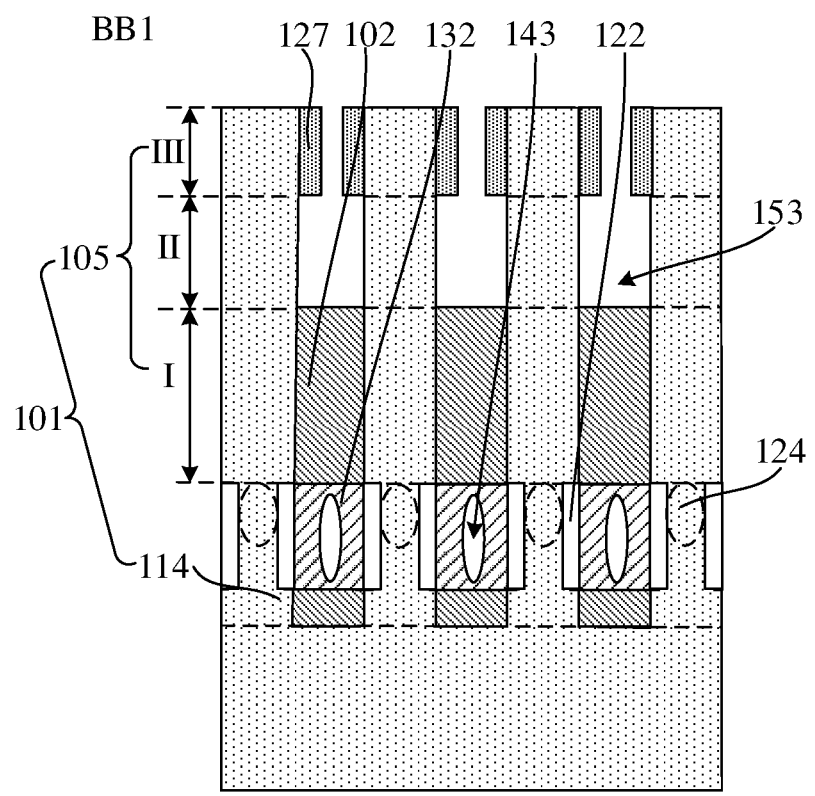

As shown in FIG. 19 and FIG. 20, a part of the second isolation layer 132 and a part of the first isolation layer 102 exposed by the through hole 163 (as shown in FIG. 18) and corresponding to the channel regions II are removed, to form the spacing 153, the remaining part of the second isolation layer 132 and the remaining part of the first isolation layer 102 commonly surrounding side walls of the first doped regions I.

It should be noted that in some embodiments, there is also a fourth isolation layer 122 between the side walls of the semiconductor pillars 105 and the second isolation layer 132, and a part of the fourth isolation layer 122 corresponding to the channel regions II is also removed when the part of the second isolation layer 132 and the part of the first isolation layer 102 corresponding to the channel regions II are removed.

Because partial top surface of the second isolation layer 132 is exposed by the through hole 163, and the material of the second isolation layer 132, the material of the first isolation layer 102, and the material of the fourth isolation layer 122 are the same but different from the material of the insulating layer 117 and the material of the dielectric layer 127, an etching solution may be injected into the through hole 163. The part of the second isolation layer 132, the part of the first isolation layer 102, and the part of the fourth isolation layer 122 surrounding the side walls of the channel regions II are removed by a wet etching process; and a part of the second isolation layer 132, a part of the first isolation layer 102, and a part of the fourth isolation layer 122 surrounding the side walls of the first doped regions I are retained.

The insulating layer 117 and the dielectric layer 127 together form a support framework. The support framework is in contact with the second doped regions III, and the support framework is partially embedded in the second isolation layer 132. During the wet etching process, the support framework has the function of supporting and fixing the semiconductor pillars 105. When the etching solution flows, an extrusion force is generated on the semiconductor pillars 105, which is beneficial to prevent the semiconductor pillars 105 from being inclined or offset under extrusion, thereby improving the stability of the semiconductor structure. The support framework wraps the side walls of the second doped regions III, which is beneficial to avoid damage to the second doped regions III caused by the etching solution.

In other embodiments, the forming spacing 153 may include: removing a part of the first isolation layer 102 and a part of the second isolation layer 132 corresponding to the second doped regions III and the channel regions II by taking the insulating layer as the mask, to form the spacing 153, the remaining part of the second isolation layer 132 and the remaining part of the first isolation layer 102 commonly surrounding the side walls of the first doped regions I. It is should be noted that in some embodiments, there is also a fourth isolation layer 122 between the side walls of the semiconductor pillars 105 and the second isolation layer 132, and a part of the fourth isolation layer 122 corresponding to the channel regions II is also removed when the part of the second isolation layer 132 and the part of the first isolation layer 102 corresponding to the channel regions II are removed.

Figure 21:
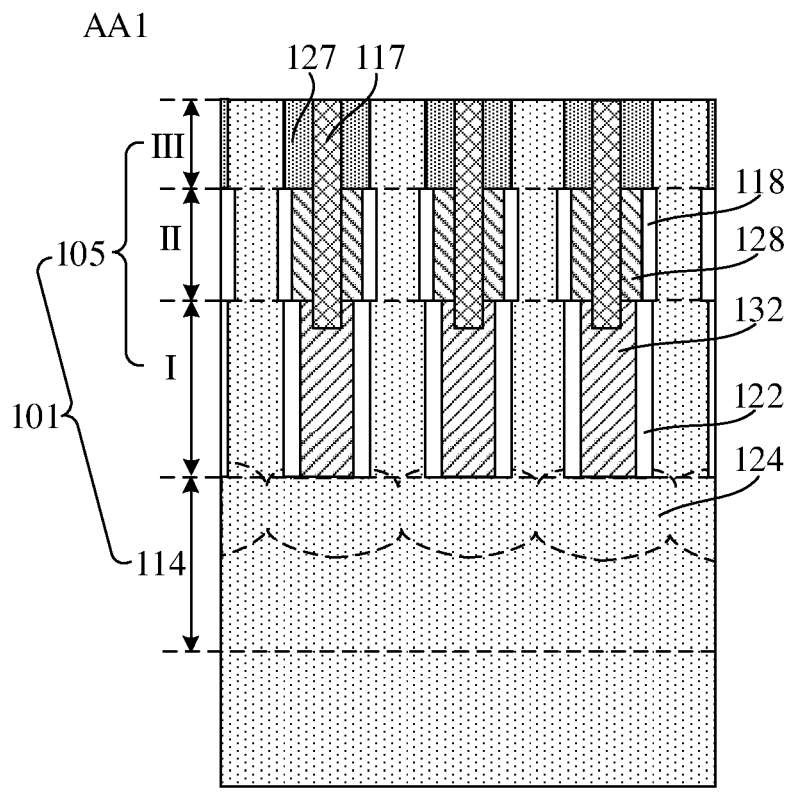
Figure 22:
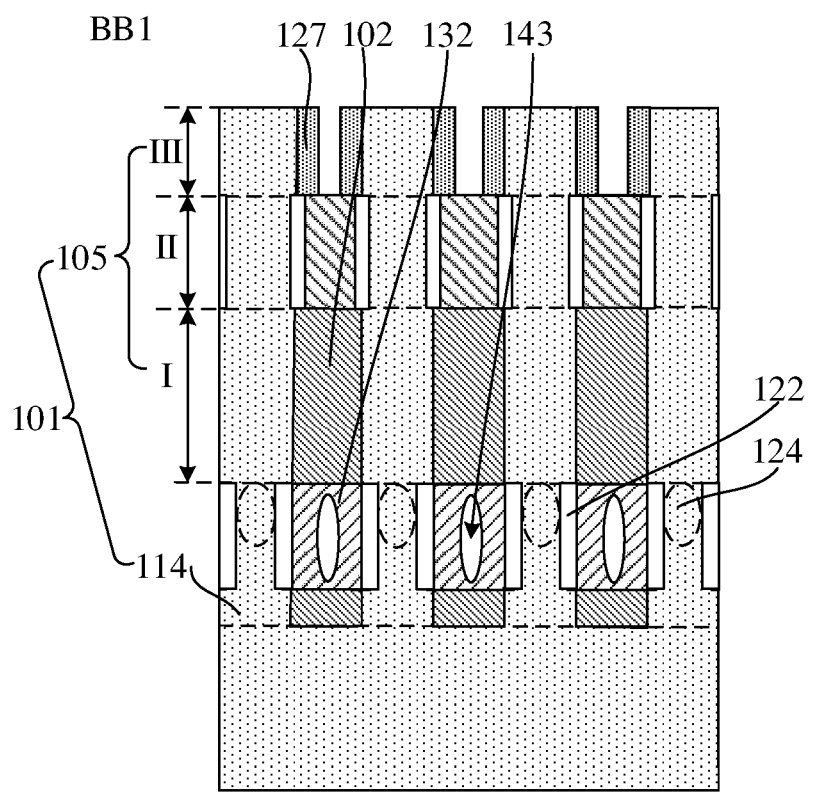

As shown in FIG. 21 and FIG. 22, after the spacing 153 (as shown in FIG. 20) is formed, in the direction perpendicular to the side wall of the second trench 123 (as shown in FIG. 3), namely in the direction X, the gate dielectric layer 118 and the word lines 128 are sequentially stacked in the spacing 153. The gate dielectric layer 118 is at least located on the side walls of the exposed channel regions II, and there is a second spacing between the gate dielectric layer 118 and the insulating layer 117.

The method of forming the gate dielectric layer 118 includes: thermally oxidizing the exposed parts of the semiconductor pillars 105. It should be noted that in some embodiments, when only the part of the first isolation layer 102 and the part of the second isolation layer 132 corresponding to the channel regions II are removed by taking the insulating layer 117 as the mask, the gate dielectric layer 118 only surrounds the side walls of the exposed channel regions II. In other embodiments, when the part of the first isolation layer 102 and the part of the second isolation layer 132 corresponding to the second doped regions III and the channel regions II are removed by taking the insulating layer 117 as the mask, the gate dielectric layer 118 is located on the side walls of the second doped regions III and the side walls of the channel regions II, and may also be located on the top surfaces of the second doped regions III. When the top surfaces of the second doped regions III are exposed outside, and no mask is formed on the top surfaces of the second doped regions III for protection, partial regions of the second doped regions III close to the top surfaces are also converted to silicon oxide in the thermal oxidation process, which may be removed subsequently by the etching process.

In some embodiments, since the semiconductor pillars 105 are made of silicon, the forming the gate dielectric layer 118 includes: thermally oxidizing the side walls of the exposed channel regions II to form the gate dielectric layer 118, the gate dielectric layer 118 covering the side wall surfaces of the remaining parts of the channel regions II. The gate dielectric layer 118 is made of silicon oxide. In other embodiments, the gate dielectric layer 118 covering the side wall surfaces of the channel regions may also be formed by the deposition process.

By thermally oxidizing the side walls of the exposed channel regions II, the channel regions II are partially converted into the gate dielectric layer 118, such that the orthographic projection of the channel region II on the bit line 114 is smaller than those of the second doped region III and the first doped region I on the bit line 114. Thus, the channel region II can be formed with a smaller sectional area in a section perpendicular to the direction Z pointing from the bit line 114 to the semiconductor pillar 105, without using the etching process. In this way, the subsequently formed word lines can better control the channel regions II, such that the GAA transistor is better controlled to switch on or off.

The orthographic projection of the periphery of the gate dielectric layer 118 on the bit lines 114 is smaller than that of the periphery of the dielectric layer 127 on the bit lines 114. That is, compared to the outer wall of the dielectric layer 127 distant from the semiconductor pillars 105, the outer wall of the gate dielectric layer 118 distant from the semiconductor pillars 105 are closer to the semiconductor pillars 105, thereby ensuring that there are a second spacing between the gate dielectric layer 118 and the dielectric layer 127, such that the word lines can subsequently surround the gate dielectric layer 118 located on the side walls of the channel regions II. Compared to the outer wall of the first isolation layer 102 distant from the semiconductor pillars 105, the outer wall of the gate dielectric layer 118 distant from the semiconductor pillars 105 may also be closer to the semiconductor pillars 105. The word lines 128 fills the second spacing, and are located only on the side wall surface of the gate dielectric layer 118 corresponding to the channel regions II.

It should be noted that in some embodiments, the word lines 128 may be of a single-layer structure. In other embodiments, the word lines may be of a stacked structure.

In some embodiments, first word lines are formed on a part of the gate dielectric layer 118, and are also located on the top surface of the remaining part of the isolation layer; and second word lines are formed on the remaining part of the gate dielectric layer 118, the work function value of the second word line is different from that of the first word line, and the first word line and the second word line are stacked in a direction Z. The forming the first word lines may include: forming initial word lines, the initial word lines filling the spacing surrounded by the gate dielectric layer 118 and the insulating layer 117; and removing the initial word lines by a certain thickness, the remaining parts of the initial word lines serving as the first word lines. The initial word lines may be formed by the deposition process. The initial word lines are made of at least one of polysilicon, titanium nitride, titanium aluminate, tantalum nitride, tantalum, cobalt, aluminum, lanthanum, copper, or tungsten.

The initial word lines fill the spacing surrounded by the gate dielectric layer 118 and the insulating layer 117 in a self-aligned manner, such that the first word lines with accurate size are formed in a self-aligned manner. There is no need to design the size of the first word line through the etching process, which simplifies the formation of the first word lines. In addition, the first word lines with small size can be obtained by adjusting the size of the spacing. The forming the second word lines are the same as the forming the first word lines. The details are not described herein again. The second word line and the first word line jointly constitute the word line 128.

Since the work function value of the second word line is different from that of the first word line, the work function value of the word line 128 are reduced by adjusting the work function value of the second word line and the work function value of the first word line and the size ratio of the first word line with respect to the second word line, thereby reducing a difference between the work function value of the word line 128 and the work function value of the semiconductor layer 101, reducing transverse electric fields of the word line 128 corresponding to the semiconductor layer 101, reducing the GIDL, increasing the turn-on/turn-off ratio of the channel region II, and improving the turn-on/turn-off sensitivity of the channel region II. In this way, when the threshold voltage of the transistor is reduced, the word line 128 is suitable for different types of transistors by adjusting related parameters of the first word line and the second word line, thereby reducing the preparation process and preparation cost of the semiconductor structure.

It should be noted that the above descriptions only take an example where the word line 128 includes two conductive layers with different work function values. In practical applications, the number of conductive layers with different word function values contained in the word line is not limited.

Figure 23:
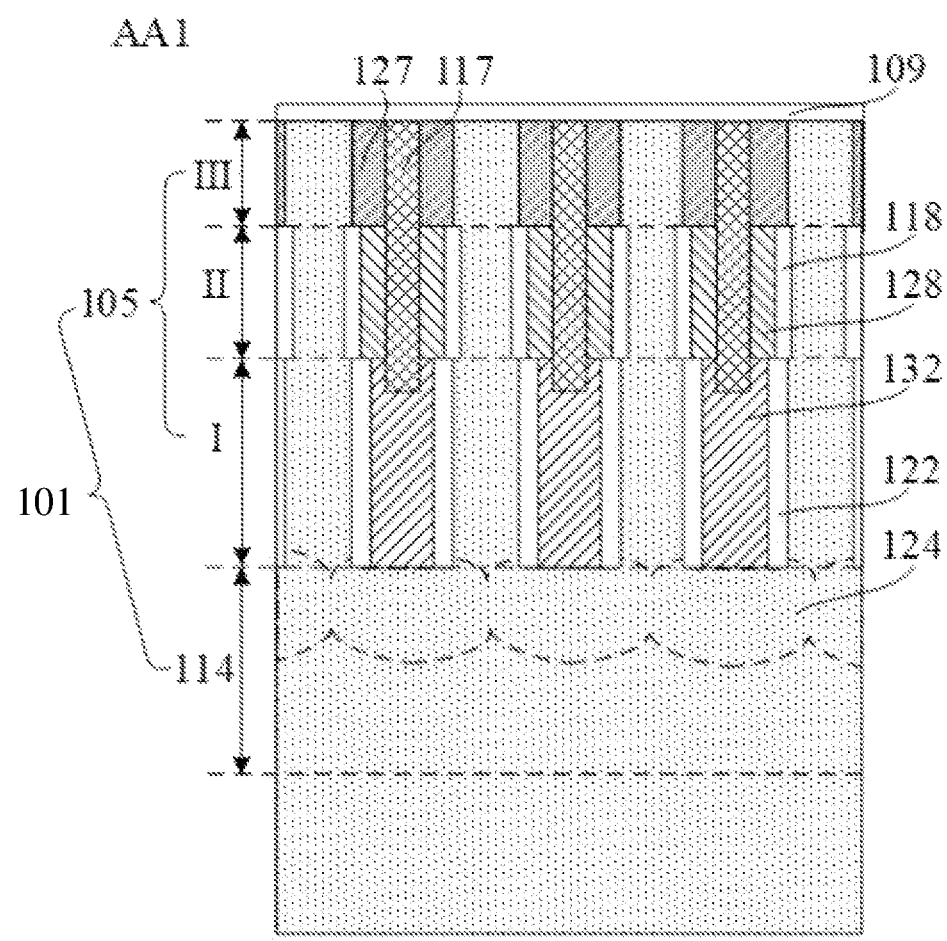
Figure 24:
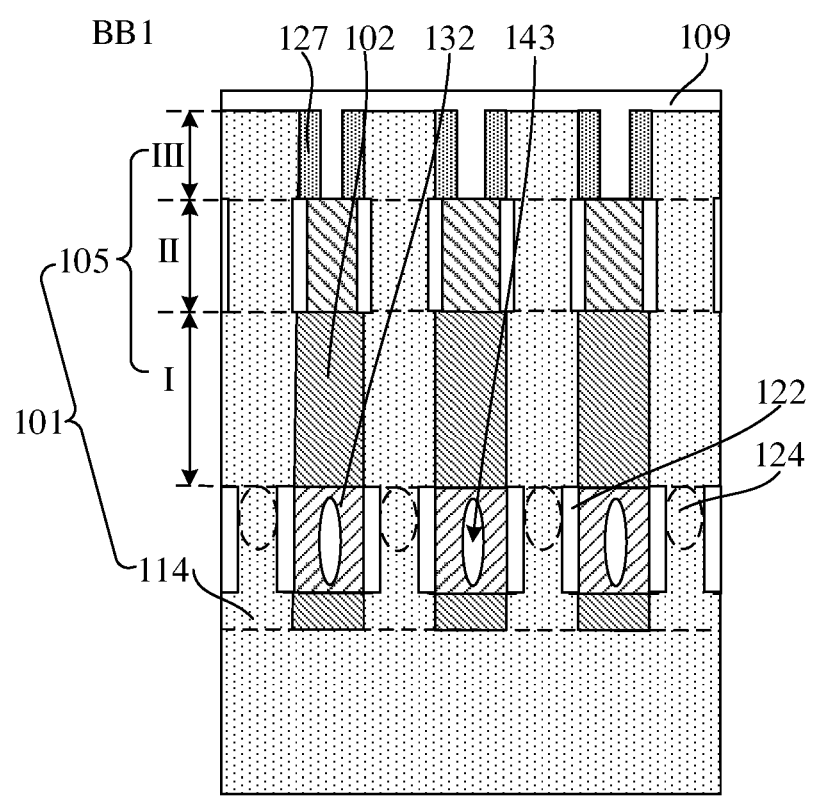

As shown in FIG. 23 and FIG. 24, after the word lines 128 are formed, a barrier layer 109 is further formed. The barrier layer 109 fills the gaps surrounded by the dielectric layer 127, and is located on a top surface commonly formed by the semiconductor pillars 105, the insulating layer 117, and the dielectric layer 127. The barrier layer 109 is made of silicon oxide, silicon nitride, or silicon oxynitride.

The part of the first isolation layer 102 on the side walls of the initial bit lines 104 is partially removed by a certain thickness to form the third trenches 133 between the adjacent initial bit lines 104, such that a width of the third trench 133 is greater than a width of the second trench 123 in the direction perpendicular to the side wall of the semiconductor pillar 105. Therefore, when the second isolation layer 132 is formed subsequently, the gaps 143 are provided in a region of a part of the second isolation layer 132 corresponding to the third trenches 133, and the adjacent initial bit lines 104 are insulated by an isolation structure including a part of the second isolation layer 132 and the gap 143. The relative dielectric constant of the air in the gap 143 is far smaller than that of the second isolation layer 132, that is, the insulativity of the air is superior to that of the second isolation layer 132, thereby facilitating the reduction of parasitic capacitance between the adjacent initial bit lines 104, and reducing the influence between the semiconductor pillars 105 electrically connected to different initial bit lines 104 to improve overall electrical properties of the semiconductor structure.

Another exemplary embodiment of the present disclosure further provides a semiconductor structure, which is formed by the manufacturing method provided in the above embodiments. The semiconductor structure provided by the another embodiment of the present disclosure is described in detail below referring to the accompanying drawings.

As shown in FIG. 23 and FIG. 24, the semiconductor structure includes: a base 100. including a plurality of semiconductor layers 101 arranged at intervals and a first isolation layer 102 located between the adjacent semiconductor layers 101, the semiconductor layers 101 including bit lines 114 extending along a first direction X and semiconductor pillars 105 located on top surfaces of the bit lines 114, the first isolation layer 102 being located on side walls of one ends of the semiconductor pillars 105 close to the bit lines 114 and located between the adjacent bit lines 114, third trenches being provided between a part of the first isolation layer 102 located between the adjacent bit lines 114 and a part of the first isolation layer 102 located on the side walls of the one ends of the semiconductor pillars 105, the third trenches being arranged at intervals along a second direction Y, and the second direction Y being different from the first direction X; and a second isolation layer 132, located on the side walls of the one ends of the semiconductor pillars 105 close to the bit lines 114 and surfaces of the bit lines 114 exposed by the third trenches, a part of the second isolation layer 132 located in the third trenches having gaps 143.

In some embodiments, the semiconductor structure may further include: a fourth isolation layer 122, located between the side walls of the first doped regions I and the second isolation layer 132.

In some embodiments, the semiconductor structure may further include: a dielectric layer 127, surrounding the side walls of the second doped regions III and located on the side walls of the insulating layer 117. The semiconductor structure may further include: a barrier layer 109, filling the gaps surrounded by the dielectric layer 127, and located on a top surface commonly formed by the semiconductor pillars 105, the insulating layer 117, and the dielectric layer 127. It should be noted that in some embodiments, the dielectric layer 127 and the barrier layer 109 are formed in different steps, and are made of different materials. In other embodiments, the dielectric layer 127 and the barrier layer 109 may be formed in a same process step, and are made of the same material.

The bit line 114 may be made of metal semiconductor compound 124. The metal semiconductor compound 124 includes at least one of cobalt silicide, nickel silicide, molybdenum silicide, titanium silicide, tungsten silicide, tantalum silicide, or platinum silicide. The metal semiconductor compound 124 has a relatively lower resistivity compared with the unmetallized semiconductor materials, and the bit line 114 including the metal semiconductor compound 124 has a lower resistivity compared with the unmetallized bit line. Thus, it is beneficial to reduce the resistance of the bit line 114 and the contact resistance between the bit line 114 and the first doped region I, and further improve the electrical properties of the semiconductor structure.

In some embodiments, the semiconductor structure may further include: a gate dielectric layer 118, at least surrounding the side walls of a partial thickness of the remaining parts of the semiconductor pillars 105 close to the second isolation layer 132; word lines 128, surrounding a side wall surface of the gate dielectric layer 118 distant from the semiconductor pillars 105, and extending along the second direction Y, a interval being provided between the adjacent word lines 128; and an insulating layer 117, at least filling the interval.

The region in a part of the second isolation layer 132 corresponding to the third trenches has the gaps 143. The relative dielectric constant of air in the gap 143 is far smaller than that of the second isolation layer 132, that is, the insulativity of the air is superior to that of the second isolation layer 132, which is conducive to reducing the parasitic capacitance between the adjacent bit lines 114, and reducing the influence between the semiconductor pillars 105 electrically connected to different bit lines 114 to improve the overall electrical properties of the semiconductor structure.

The embodiments or implementations of this specification are described in a progressive manner, and each embodiment focuses on differences from other embodiments. The same or similar parts between the embodiments may refer to each other.

In the description of this specification, the description referring to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail referring to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the semiconductor structure and manufacturing method thereof provided by the present disclosure, a part of the first isolation layer on the side walls of the initial bit lines is partially removed by a certain thickness to form the third trenches between the adjacent initial bit lines, such that a width of the third trench is greater than a width of the second trench in the direction perpendicular to the side wall of the semiconductor pillar. Therefore, when the second isolation layer is formed subsequently, the gaps are provided in a region of a part of the second isolation layer corresponding to the third trenches, and the adjacent initial bit lines are insulated by an isolation structure including a part of the second isolation layer and the gap. The relative dielectric constant of air in the gap is far smaller than that of the second isolation layer, that is, the insulativity of the air is superior to that of the second isolation layer, thereby facilitating the reduction of parasitic capacitance between the adjacent initial bit lines, and reducing the influence between the semiconductor pillars electrically connected to different initial bit lines to improve overall electrical properties of the semiconductor structure.

The invention claimed is:
1. A method of manufacturing a semiconductor structure, comprising:
providing a base;
forming a plurality of first trenches extending along a first direction in the base, the first trenches forming the base into semiconductor layers arranged at intervals, and filling the first trenches with a first isolation layer;

forming a plurality of second trenches extending along a second direction in the semiconductor layers and the first isolation layer, to form the semiconductor layers into a plurality of separate semiconductor pillars and initial bit lines located below the semiconductor pillars, a depth of the second trench being smaller than a depth of the first trench;

forming third trenches parallel to the first trenches at positions lower than the second trenches, a width of the third trench being greater than a width of the second trench in a direction perpendicular to a side wall of the semiconductor pillar; and filling the second trenches and the third trenches with a second isolation layer, wherein a part of the second isolation layer in the third trenches has gaps.

2. The method of manufacturing according to claim 1, wherein a width of the first trench is greater than or as wide as the width of the second trench in the direction perpendicular to the side wall of the semiconductor pillar.

3. The method of manufacturing according to claim 1, wherein the forming third trenches parallel to the first trenches at positions lower than the second trenches comprises:

forming a protective layer, the protective layer being located on side walls of the second trenches, and exposing top surfaces of the initial bit lines and a top surface of a part of the first isolation layer between adjacent initial bit lines;

partially removing a part of the first isolation layer located on side walls of the initial bit lines by a certain thickness by taking the protective layer as a mask, to form the third trenches; and removing the protective layer.

4. The method of manufacturing according to claim 3, before the forming a protective layer, the method further comprises: forming a third isolation layer, the third isolation layer being located only on exposed side wall surfaces of trenches.

5. The method of manufacturing according to claim 3, wherein an etch selectivity between the first isolation layer and the protective layer under a same etching process is greater than or equal to 50.

6. The method of manufacturing according to claim 3, after the forming third trenches and before forming the second isolation layer, the method further comprises:

forming a fourth isolation layer on surfaces of the initial bit lines exposed by the third trenches, wherein the fourth isolation layer does not change an overall morphology of the third trenches.

7. The method of manufacturing according to claim 6, after the forming a fourth isolation layer and before the forming the second isolation layer, the method further comprises:

removing a part of the fourth isolation layer located on the top surfaces of the initial bit lines; and performing a metal silicidation on exposed parts of the initial bit lines, to form bit lines, a material of the bit line comprising a metal semiconductor compound.

8. The method of manufacturing according to claim 7, wherein in a direction of the semiconductor pillar pointing to the bit line, a depth of the third trench is greater than a depth of the metal semiconductor compound.

9. The method of manufacturing according to claim 1, further comprising:

partially removing a part of the second isolation layer in the second trenches by a certain thickness to form grooves, the groove extending along the second direction;

forming an insulating layer filling the grooves;

partially removing a part of the first isolation layer and a part of the second isolation layer on side walls of the semiconductor pillars by a certain thickness by taking the insulating layer as a mask, to form a spacing between the semiconductor pillars and the insulating layer; and in a direction perpendicular to a side wall of the second trench, sequentially stacking a gate dielectric layer and word lines in the spacing.

10. The method of manufacturing according to claim 9, wherein along a direction of the initial bit line pointing to the semiconductor pillar, the semiconductor pillar comprises a first doped region, a channel region, and a second doped region arranged in sequence; a method of forming the grooves comprises a graphical processing, and side walls of the grooves are composed of a remaining part of the second isolation layer; and in a direction of the first doped region pointing to the channel region, a depth of the groove is greater than or equal to a sum of a height of the channel region and a height of the second doped region.

11. The method of manufacturing according to claim 10, wherein forming the spacing comprises:

removing a part of the first isolation layer and a part of the second isolation layer corresponding to second doped regions by taking the insulating layer as the mask;

forming a dielectric layer, the dielectric layer surrounding side walls of the second doped regions and being located on a side wall of the insulating layer, a side wall of the dielectric layer defining a through hole, a bottom of the through hole exposing the first isolation layer, and a material of the dielectric layer and a material of the insulating layer being both different from a material of the first isolation layer; and removing a part of the second isolation layer and a part of the first isolation layer exposed by the through hole and corresponding to channel regions, to form the spacing, a remaining part of the second isolation layer and a remaining part of the first isolation layer commonly surrounding side walls of first doped regions.

12. The method of manufacturing according to claim 10, wherein forming the spacing comprises:

removing a part of the first isolation layer and a part of the second isolation layer corresponding to second doped regions and channel regions by taking the insulating layer as the mask, to form the spacing, a remaining part of the second isolation layer and a remaining part of the first isolation layer commonly surrounding side walls of first doped regions.

13. The method of manufacturing according to claim 11, wherein the gate dielectric layer is at least located on side walls of the exposed channel regions, and there is a second spacing between the gate dielectric layer and the insulating layer.

14. The method of manufacturing according to claim 12, wherein the gate dielectric layer is at least located on side walls of the exposed channel regions, and there is a second spacing between the gate dielectric layer and the insulating layer.

* * * * *